(12) United States Patent
Yoshimatsu et al.

(10) Patent No.: US 9,437,460 B2
(45) Date of Patent: Sep. 6, 2016

(54) METHOD FOR MANUFACTURING SEMICONDUCTOR DEVICE

(71) Applicant: Mitsubishi Electric Corporation, Tokyo (JP)

(72) Inventors: Naoki Yoshimatsu, Tokyo (JP); Kiyohiro Uchida, Tokyo (JP); Taketoshi Shikano, Tokyo (JP); Masayoshi Shinkai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/665,577

(22) Filed: Mar. 23, 2015

(65) Prior Publication Data
US 2015/0380274 A1 Dec. 31, 2015

(30) Foreign Application Priority Data

Jun. 27, 2014 (JP) .................................. 2014-132430

(51) Int. Cl.
| | | |
|---|---|---|
| H01L 21/44 | (2006.01) | |
| H01L 21/48 | (2006.01) | |
| H01L 21/56 | (2006.01) | |
| H01L 23/498 | (2006.01) | |
| H01L 23/00 | (2006.01) | |
| H01L 23/31 | (2006.01) | |
| H01L 21/50 | (2006.01) | |
| H01L 23/373 | (2006.01) | |

(52) U.S. Cl.
CPC ........... *H01L 21/4853* (2013.01); *H01L 21/50* (2013.01); *H01L 21/56* (2013.01); *H01L 23/3121* (2013.01); *H01L 23/49811* (2013.01); *H01L 24/83* (2013.01); *H01L 23/3735* (2013.01); *H01L 23/49861* (2013.01); *H01L 2224/32225* (2013.01); *H01L 2224/83801* (2013.01); *H01L 2924/13055* (2013.01); *H01L 2924/13091* (2013.01)

(58) Field of Classification Search
CPC .................... H01L 21/4885; H01L 21/02697; H01L 23/49811; H01L 23/49827; H01L 24/80; H01L 24/89; H01L 24/91; H01L 24/92; H01L 24/13; H01L 24/16; H01L 24/66; H01L 24/69; H01L 24/72
See application file for complete search history.

(56) References Cited

U.S. PATENT DOCUMENTS 5,118,027 A * 6/1992 Braun .................. B23K 1/20
228/180.22

FOREIGN PATENT DOCUMENTS

| JP | 2010-129818 A | 6/2010 |
|---|---|---|
| JP | 2010-186953 A | 8/2010 |
| JP | 2011-187819 A | 9/2011 |

\* cited by examiner

*Primary Examiner* — Zandra Smith
*Assistant Examiner* — Evan Clinton
(74) *Attorney, Agent, or Firm* — Studebaker & Brackett PC

(57) ABSTRACT

Entry of resin into a cylindrical electrode can be suppressed without excessively increasing the number of parts and without unnecessarily damaging members. For this purpose, a semiconductor chip and a cylindrical electrode are mounted on one main surface of substrate. The substrate, the semiconductor chip, and the cylindrical electrode are sealed with resin material such that the cylindrical electrode has one end mounted to the substrate and the other opposite end at least exposed. After the step of sealing, an opening extending from the other end of the cylindrical electrode to a cavity in the cylindrical electrode is formed. Before performing the step of forming an opening, the other end of the cylindrical electrode is closed.

5 Claims, 7 Drawing Sheets

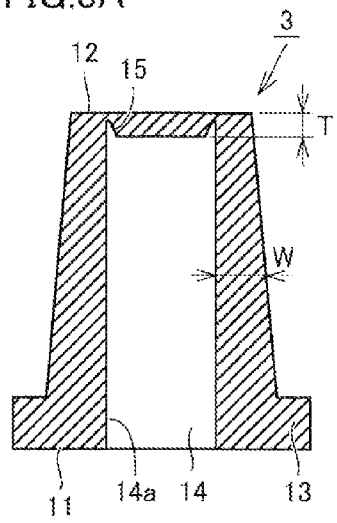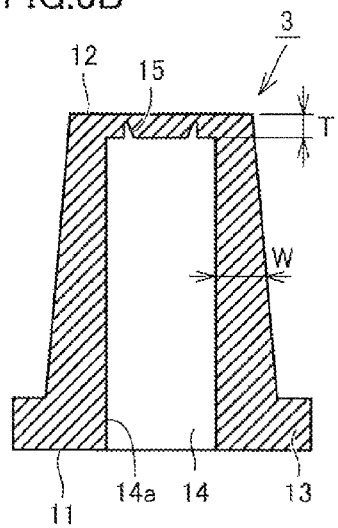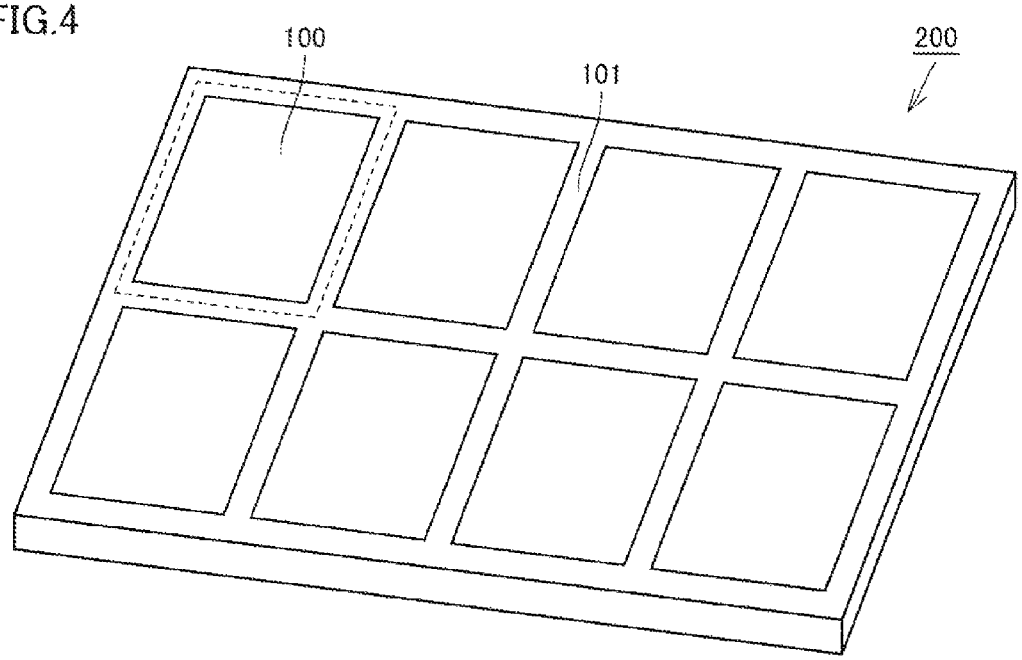

METHOD FOR MANUFACTURING SEMICONDUCTOR DEVICE

BACKGROUND OF THE INVENTION

1. Field of the Invention

The present invention relates to a method for manufacturing a semiconductor device, and more particularly to a method for manufacturing a semiconductor device for use in an inverter for controlling a motor of an electric vehicle or an industrial equipment, or for use in a converter for regeneration.

2. Description of the Background Art

A power semiconductor device has a configuration in which semiconductor elements such as a power MOSFET (Metal Oxide Semiconductor Field Effect Transistor), an IGBT (Insulated Gate Bipolar Transistor), and a diode constituting a circuit are sealed with resin to protect the semiconductor elements. The sealing with resin is performed by bringing into a metal mold an object to be sealed with resin, and injecting mold resin into the metal mold. The object includes, for example, a substrate, a circuit pattern formed on one main surface of the substrate, a semiconductor element, and a cylindrical electrode, which are joined together.

The cylindrical electrode is an external connection terminal which is connected to the semiconductor element in the sealed resin to electrically connect the semiconductor element, an external electrode, and the like. Thus, the cylindrical electrode has one end mounted to a substrate and the other opposite end exposed to outside of the resin. Power semiconductor devices using the cylindrical electrode described above are disclosed in, for example, the following Japanese Patent Laying-Open No. 2011-187819, Japanese Patent Laying-Open No. 2010-129818, and Japanese Patent Laying-Open No. 2010-186953.

Japanese Patent Laying-Open No. 2011-187819 discloses a technique of using a cap jig for closing an opening at an end of a cylindrical electrode. Japanese Patent Laying-Open No. 2010-129818 discloses a technique of allowing a top face of a sleeve to come in contact with an inner wall surface of a metal mold for sealing with resin in a state where the sleeve is press-fitted to an end of a cylindrical electrode. These techniques suppress entry of resin into a cylindrical electrode during sealing with resin. Moreover, Japanese Patent Laying-Open No. 2010-186953 discloses a technique of allowing an uppermost face of a cylindrical electrode to come in direct contact with an inner wall surface of a metal mold for sealing with resin, and it suppresses entry of resin into the cylindrical electrode during the sealing with resin.

However, when a cap jig, a sleeve, or the like is used as with Japanese Patent Laying-Open No. 2011-187819 and Japanese Patent Laying-Open No. 2010-129818, a part is used which seems to be unnecessary in an original configuration of the semiconductor device, so that the number of parts may increase excessively, and the cost for the semiconductor device may be raised.

Moreover, in Japanese Patent Laying-Open No. 2010-186953, a cylindrical electrode is used which has a spring characteristic provided by a shape having different sizes of outer peripheries in a planar view for each region, and the metal mold for sealing with resin directly presses the cylindrical electrode. Since the cylindrical electrode and a base substrate to which the cylindrical electrode is mounted are joined with hot-melt joint material such as solder, a damage on the joint part with the solder due to a pressure from above is concerned even when the cylindrical electrode has a spring characteristic.

The present invention was made in view of the problem described above, and its object is to provide a method for manufacturing a semiconductor device capable of suppressing entry of resin into a cylindrical electrode without increasing the number of parts excessively and without damaging a member unnecessarily.

SUMMARY OF THE INVENTION

A method for manufacturing a semiconductor device according to the present invention includes the following steps. Firstly, a semiconductor chip and a cylindrical electrode are mounted on one main surface of a substrate. The substrate, the semiconductor chip, and the cylindrical electrode are sealed with resin material such that the cylindrical electrode has one end mounted to the substrate and the other opposite end at least exposed. After the step of sealing, an opening is formed which extends from the other end of the cylindrical electrode to a cavity in the cylindrical electrode. Before performing the step of forming an opening, the other end of the cylindrical electrode is closed.

According to the present invention, an opening is formed at the other end of the cylindrical electrode after the step of sealing with resin material, and the opening is not formed at the other end of the cylindrical electrode during the sealing step. Therefore, the possibility of entry of the resin material from the other end of the cylindrical electrode during the sealing step can be eliminated without increasing the number of parts excessively and damaging a member unnecessarily.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3A is a schematic cross-sectional view representing a first example of the configuration of the cylindrical electrode of FIG. 2.

FIG. 3B is a schematic cross-sectional view representing a second example of the configuration of the cylindrical electrode of FIG. 2.

FIG. 4 is a schematic perspective view representing the power module before being cut as with FIG. 1.

DESCRIPTION OF THE PREFERRED EMBODIMENT

In the following, an embodiment of the present invention will be described with reference to the drawings.

Figure 1:
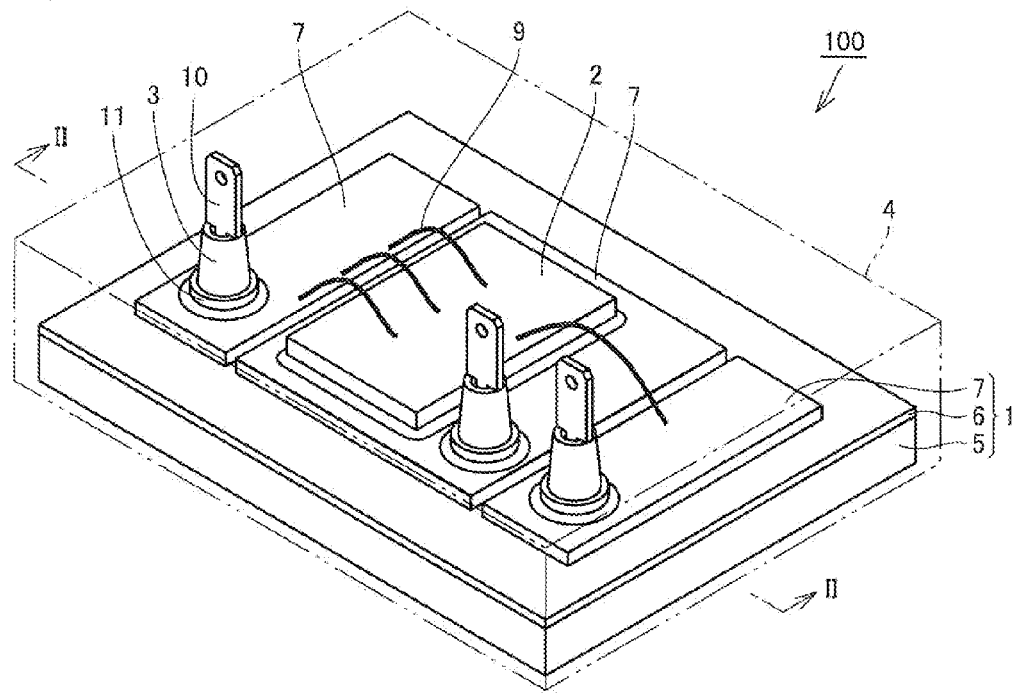
FIG. 1 is a schematic perspective view representing a configuration of a power module according to the present embodiment.

Firstly, a configuration of a power module will be described as a configuration of a semiconductor device of the present embodiment with reference to FIGS. 1 and 2. Referring to FIG. 1, a power module 100 of the present embodiment mainly includes a substrate 1, a semiconductor chip 2, cylindrical electrodes 3, and mold resin 4 (resin material). It should be noted that, in FIG. 1, mold resin 4 is illustrated with imaginary lines in view of improving the visibility of the drawing. Moreover, in FIG. 2 and subsequent cross-sectional views, wires 9 which can be seen in the back of portions illustrated in the drawings and will be described later are added in view of easy understanding.

Figure 2:
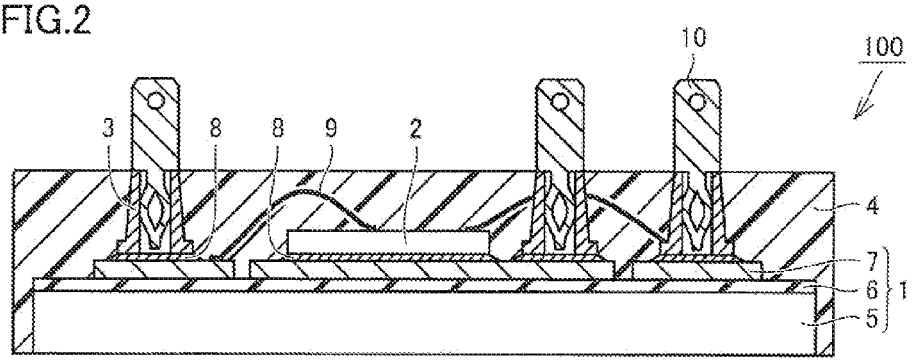
FIG. 2 is a schematic cross-sectional view representing the configuration of the power module according to the present embodiment taken along the II-II line of FIG. 1.

Referring to FIGS. 1 and 2, substrate 1 includes, for example, a metal substrate 5, an insulating layer 6, and circuit patterns 7, and has a configuration in which these three members are stacked in this order. Metal substrate 5 is a plate-like member which is arranged to radiate heat generated during driving of semiconductor chip 2 to outside in a highly efficient manner, and is formed of metal material such as copper with a favorable thermal conductivity. Insulating layer 6 is a plate-like member formed of, for example, epoxy-based resin with a favorable thermal conductivity. Circuit pattern 7 is formed of, for example, a thin plate of copper. Circuit pattern 7 has, for example, a rectangular shape in a planar view, and a plurality of circuit patterns 7 are arranged apart from each other. Although circuit patterns 7 are aligned in rows with one in a depth direction and three in a lateral direction in FIG. 1, it is not always necessary that the plurality of circuit patterns 7 are aligned in rows, and they may be aligned disorderly.

Semiconductor chip 2 is bonded on one main surface of circuit pattern 7 which is an uppermost layer of substrate 1 (on a main surface on an upper side which is opposite to a lower side in contact with insulating layer 6) through solder 8. Herein, as one example, semiconductor chip 2 is bonded on one main surface of circuit pattern 7 at a center among three circuit patterns 7 aligned in FIG. 2. A semiconductor element capable of supplying high electric power, such as an IGBT or a diode, is mounted to semiconductor chip 2.

For example, electrical connections between circuit patterns 7 adjacent to each other among three circuit patterns 7 aligned in FIG. 2 are established by wires 9. Wire 9 is formed by, for example, aluminum or high-purity copper. Wire 9 is connected to the surfaces of circuit patterns 7 by, for example, a generally known wire bonding technique. In FIG. 2, semiconductor chip 2 and circuit patterns 7 adjacent to circuit pattern 7 on which semiconductor chip 2 is mounted are electrically connected by wires 9.

Cylindrical electrode 3 is bonded on one main surface of circuit pattern 7 of substrate 1 through solder 8. Cylindrical electrode 3 is a conductive member extending in the vertical direction of the drawing, and is an external connection terminal to be electrically connected to outside of power module 100. Cylindrical electrode 3 is formed of, for example, copper. In FIG. 2, one cylindrical electrode 3 is connected onto one main surface of each circuit pattern 7.

As will be described later, a cavity is formed in cylindrical electrode 3, and this cavity penetrates through cylindrical electrode 3 from one end of cylindrical electrode 3 (for example, a lowermost portion in FIG. 2) to the other end opposite to the one end (for example, an uppermost portion in FIG. 2). Moreover, cylindrical electrode 3 is inclined so that the size of its outer periphery in a planar view is gradually reduced from the lower side to the upper side of the drawing.

Mold resin 4 buries and seals substrate 1, semiconductor chip 2, and cylindrical electrodes 3 so as to cover a surface other than a lower side surface of substrate 1 in FIG. 2, semiconductor chip 2, and a surface other than an upper end of cylindrical electrode 3 in FIG. 2. Accordingly, for example, wires 9 are also buried in mold resin 4.

The lower side surface of substrate 1, in other words, the lower side surface of metal substrate 5 is exposed without being covered with mold resin 4. Accordingly, metal substrate 5 can serve as a radiator plate.

Moreover, the uppermost portion of cylindrical electrode 3 is exposed without being covered with the mold resin. Accordingly, an extraction electrode 10, which is made of copper and having a film of nickel or the like on its surface, is inserted from an upper side of FIG. 2 into cylindrical electrode 3. Extraction electrode 10 has a length, which reaches a lowermost portion of cylindrical electrode 3 and projects above the uppermost portion of cylindrical electrode 3 in the vertical direction of FIG. 2 when extraction electrode 10 is inserted to cylindrical electrode 3. Moreover, for example, a plating film of copper is formed on an inner wall surface of the cavity in cylindrical electrode 3, and this plating film comes into contact with the surface of extraction electrode 10 inserted to the cavity. Accordingly, a semiconductor element or the like in mold resin 4 and an external electrode or the like of power module 100 can be electrically connected with use of extraction electrode 10 in cylindrical electrode 3.

The electrical connection between inside of power module 100 and outside of power module 100 with use of extraction electrode 10 inserted into cylindrical electrode 3 as with the present embodiment has the following advantage. For example, when the extraction electrode is directly connected onto the surface of semiconductor chip 2 or the like without inserting the extraction electrode into cylindrical electrode 3, it would be necessary to expose the extraction electrode from the uppermost surface of mold resin 4, and it would be necessary to allow the extraction electrode to come into contact with the inner wall surface of the metal mold during sealing with resin (to suppress a supply of resin to its end). Since a very high positional accuracy and form accuracy such as controlling a position of the extraction electrode projecting from mold resin 4 are required to achieve it by processing with the metal mold, high-accuracy manufacturing would be difficult.

However, by sealing only cylindrical electrode 3 with mold resin 4 and thereafter inserting extraction electrode 10 which actually provides the electrical connection, the electrode exposed from mold resin 4 without being covered with mold resin 4 can be readily formed. Moreover, when extraction electrode 10 is to be inserted later, and a shape of the metal mold for use in sealing with resin is designed, it would not be necessary to take into account the shape of extraction electrode 10 projecting from mold resin 4, so that the shape of the metal mold can be simplified, and the cost for the metal mold can be reduced. Further, since extraction electrode 10 can be readily inserted into cylindrical electrode 3 by the press-fit connection, the shape of extraction electrode 10 can be selected freely.

With reference to FIGS. 3A and 3B, configurations of cylindrical electrode 3 will be described more in detail.

Referring to FIGS. 3A and 3B, cylindrical electrode 3 has a shape which is inclined so that the size of the outer periphery in a planar view (dimension in the horizontal direction of FIGS. 3A and 3B) decreases gradually from a lower end 11, which is one end (the lower side of the drawing bonded by solder 8) in the extending direction of cylindrical electrode 3, toward an upper end 12, which is the other end (upper side in the drawing) opposite to lower end 11. It should be noted that the planar shape of cylindrical electrode 3 may be, for example, a circular shape, or a polygonal shape such as a square shape.

Cylindrical electrode 3 includes a flange 13, a cavity 14, and a cavity cutout 15, before power module 100 is completed (particularly, before the opening is formed on the side of upper end 12), as particularly shown in FIGS. 3A and 3B. Flange 13 is a region which is formed at lower end 11 of cylindrical electrode 3 and has a size of its outer periphery in a planar view gradually increased as compared to a region other than flange 13 (region on a side of upper end 12 of flange 13) to be able to join with substrate 1 with a wide area. Cylindrical electrode 3 is mounted to substrate 1 by connecting the lowermost portion, in other words, lower end 11 of flange 13 to underlying circuit pattern 7 by means of solder 8.

Cavity 14 is a hollow region formed in cylindrical electrode 3 so as to extend from lower end 11 to upper end 12 of cylindrical electrode 3. Although it is not illustrated in the drawing, cavity 14 may have, for example, a circular shape or a square shape in a planar view. Preferably, the size of cavity 14 in a planar view is nearly constant from lower end 11 to an end on a side of upper end 12. Preferably, the constant size of cavity 14 in a planar view and the gradually reduced size of the outer periphery of cylindrical electrode 3 in a planar view from lower end 11 to upper end 12 cause a wall thickness W of a main body of cylindrical electrode 3 arranged on a side of cavity 14 to be thinner gradually from lower end 11 to upper end 12.

Particularly at least a part of cavity 14 on a side most close to upper end 12 is formed with a cavity cutout 15. It is preferable that cavity cutout 15 is formed directly above an edge 14*a* of the outermost periphery of, for example, cavity 14 in a planar view, as shown in FIG. 3A. However, cavity cutout 15 may be formed directly above any region other than directly above edge 14*a*, as shown in FIG. 3B.

A wall thickness T of the main body of cylindrical electrode 3 at upper end 12 in a region overlapping with cavity 14 in a planar view is thinner in cavity cutout 15 than other region. As shown in FIGS. 3A and 3B, cavity cutout 15 is formed so as to have a circular planar shape having an equal distance from the center of cavity 14. However, not limited to such a form, cavity cutout 15 may be formed, for example, as two small cutouts having components intersecting like a cross in a planar view at a part of the main body of cylindrical electrode 3 directly above cavity 14.

However, as will be described later, to form power module 100, cylindrical electrode 3 of FIGS. 3A and 3B is mounted on the main surface of circuit pattern 7 and sealed by mold resin 4, and thereafter a thick portion of some region on a side of upper end 12 is removed, and edge 14*a* of cavity 14 penetrates from lower end 11 to upper end 12. Therefore, as shown in FIG. 2, cavity 14 of cylindrical electrode 3 of power module 100 completed as a product penetrates from lower end 11 to upper end 12, as being different from cylindrical electrode 3 before completion shown in FIGS. 3A and 3B (before opening 17 which will be described later is formed).

Referring to FIG. 4, power module 100 shown in FIGS. 1 to 3B described above is formed from power module 200 which is formed to have, for example, a plurality of modules having the same configuration as power module 100 are arranged apart from each other on the main surface of substrate 1. In other words, provided that a region sandwiched between a pair of power modules 100 adjacent to each other is a dicing line region 101, power module 200 is cut along dicing line region 101, so that power module 100 is formed.

Next, referring to FIGS. 5 to 13, a method for forming power module 100 will be described. In FIGS. 5 to 13, only a region of single power module 100 surrounded by dotted lines in FIG. 4 and cut from power module 200 is basically shown, and other region is omitted from illustration. However, the processes which are the same as those of FIGS. 5 to 13 are applied to entire power module 200 (each of the plurality of power modules 100).

Figure 5:
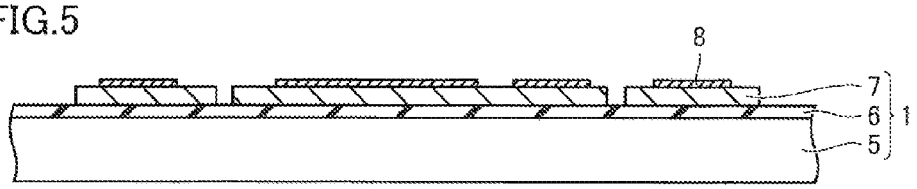
FIG. 5 is a schematic cross-sectional view corresponding to the region surrounded by the dotted lines in FIG. 4 and representing a first step of the method for manufacturing a power module according to the present embodiment.

Referring to FIG. 5, firstly, substrate 1 is prepared which has the configuration in which metal substrate 5, insulating layer 6, and circuit patterns 7 are suitably stacked in this order, and solder 8 is suitably supplied to the one main surface of circuit pattern 7 (upper side in FIG. 5) which is the uppermost layer. Preferably, solder 8 is supplied by, for example, a generally known micro-soldering.

Figure 6:
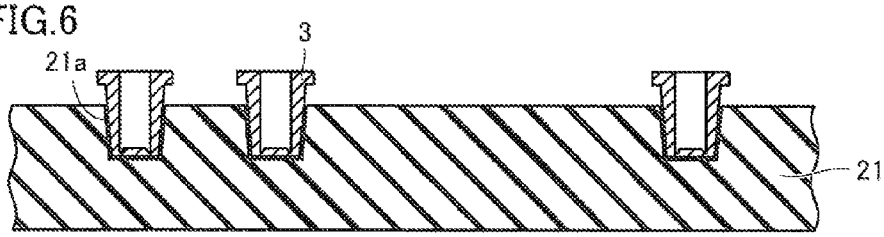
FIG. 6 is a schematic cross-sectional view corresponding to the region surrounded by the dotted lines in FIG. 4 and representing a second step of the method for manufacturing a power module according to the present embodiment.

Referring to FIG. 6, a plurality of cylindrical electrodes 3 prepared in advance and having the shape shown in FIGS. 3A and 3B (upper end 12 is closed) are retained respectively by a plurality of retainers 21*a* formed in a single alignment jig 21. Retainers 21*a* are formed at locations corresponding to locations where cylindrical electrodes 3 should be arranged to form power module 100, and are present to have concave shapes formed partially in the surface on a side of facing substrate 1, for example.

Cylindrical electrode 3 having the shape shown in FIGS. 3A and 3B is formed by molding melted copper in a metal mold. Preferably, this molding is performed with use of, for example, cold deep drawing and press working. Cavity cutout 15 is also worked to have a desired shape with use of the metal mold. Preferably, wall thickness T of upper end 12 shown in FIGS. 3A and 3B is formed to be, for example, greater than or equal to 50 μm and less than or equal to 100 μm in a portion other than the portion thinned by cavity cutout 15, and the portion thinned by cavity cutout 15 may be thinner than that.

Formed cylindrical electrodes 3 are placed in retainers 21a of alignment jig 21 by means of, for example, a part feeder.

Figure 7:
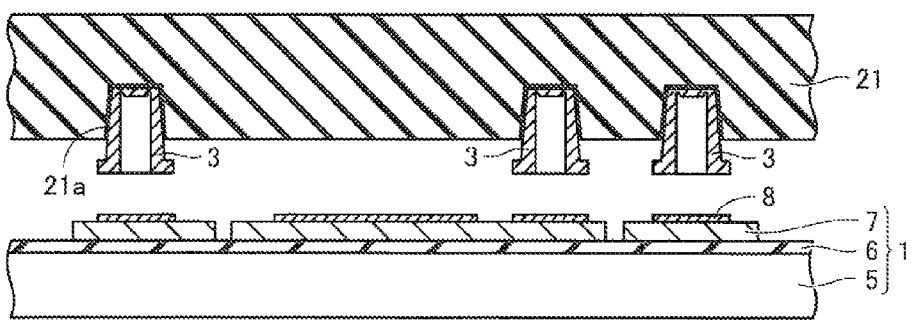
FIG. 7 is a schematic cross-sectional view corresponding to the region surrounded by the dotted lines in FIG. 4 and representing a third step of the method for manufacturing a power module according to the present embodiment.

Referring to FIG. 7, alignment jig 21 of FIG. 6 is vertically flipped to set alignment jig 21 retaining the plurality of cylindrical electrodes 3 to face substrate 1 each other with a space. At this time, since the side on which retainers 21a are formed is oriented toward the lower side of FIG. 7 so as to face substrate 1, retainers 21a preferably have a retaining force to an extent that cylindrical electrodes 3 do not drop from retainers 21a. At this time, it is preferable to place semiconductor chip 2 at a desired position (on desired solder 8).

Figure 8:
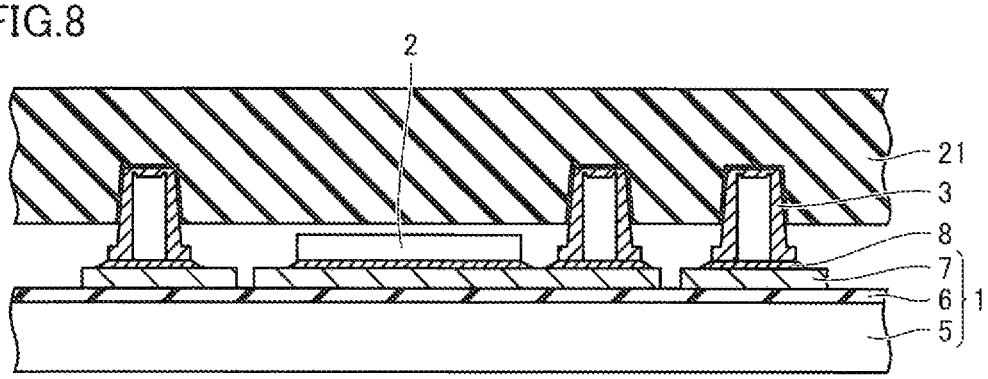
FIG. 8 is a schematic cross-sectional view corresponding to the region surrounded by the dotted lines in FIG. 4 and representing a fourth step of the method for manufacturing a power module according to the present embodiment.

Referring to FIG. 8, alignment jig 21 of FIG. 7 is moved downward, so that cylindrical electrodes 3 are placed to come into contact with solder 8 on circuit patterns 7 directly below cylindrical electrodes 3. As can be seen, alignment jig 21 can place the plurality of cylindrical electrodes 3 to come into contact with solder 8 on circuit patterns 7 provided directly below alignment jig 21 collectively (at one time). Next, for example, a generally known solder reflow process is used in that state to connect each cylindrical electrode 3 and semiconductor chip 2 to circuit patterns 7.

In the manner described above, semiconductor chip 2 and cylindrical electrodes 3 are mounted on one main surface of substrate 1.

Figure 9:
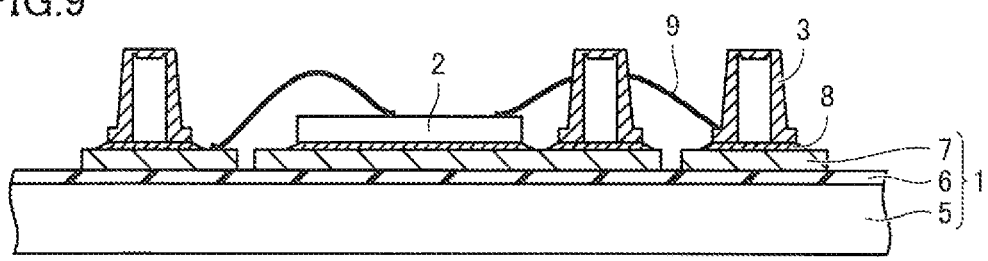
FIG. 9 is a schematic cross-sectional view corresponding to the region surrounded by the dotted lines in FIG. 4 and representing a fifth step of the method for manufacturing a power module according to the present embodiment.

Referring to FIG. 9, after alignment jig 21 is removed, for example, the electrode on the surface of semiconductor chip 2 and circuit patterns 7 are bonded by ultrasonic bonding with use of wire 9 of copper or aluminum.

Figure 10:
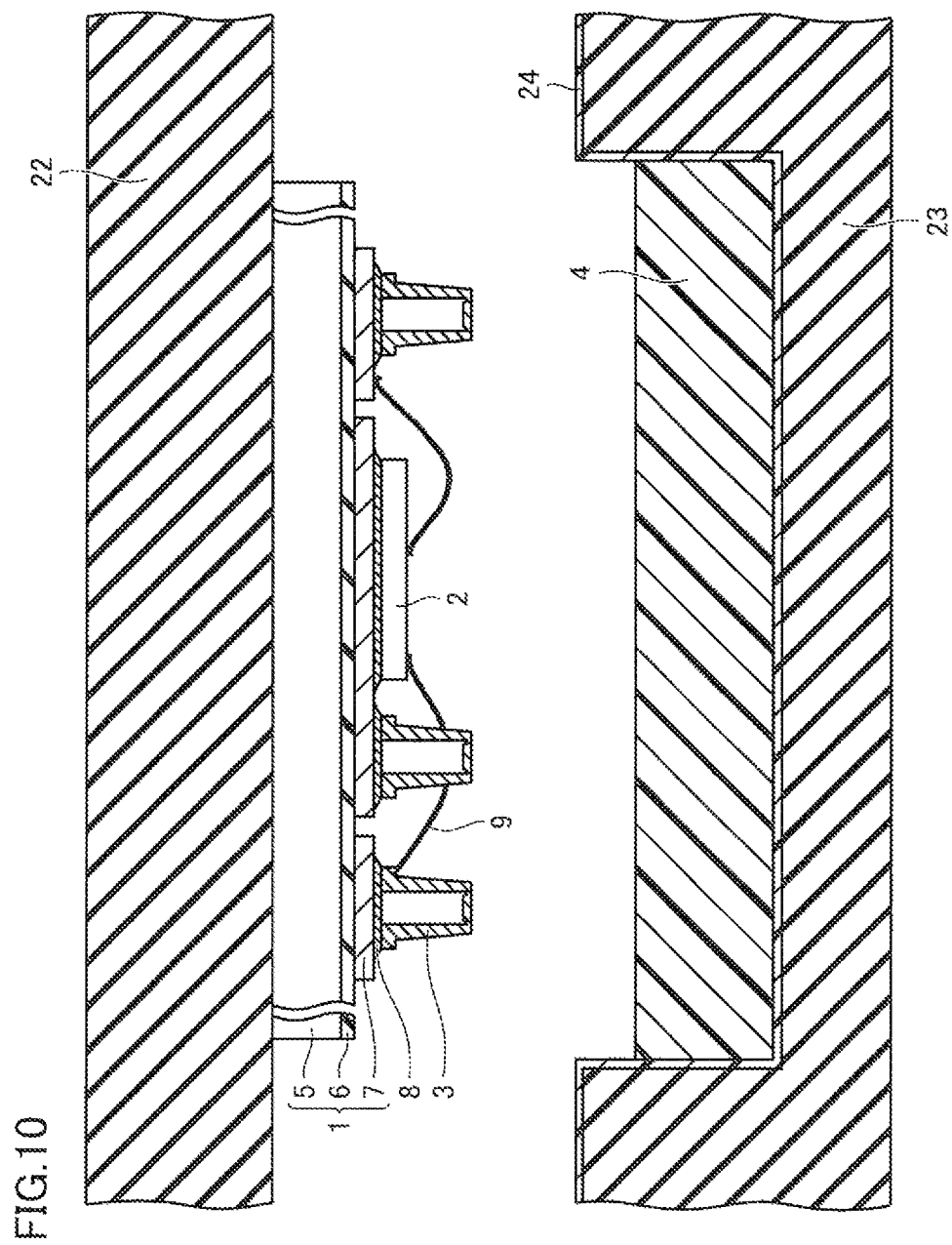
FIG. 10 is a schematic cross-sectional view corresponding to the region surrounded by the dotted lines in FIG. 4 and representing a sixth step of the method for manufacturing a power module according to the present embodiment.

Referring to FIG. 10, substrate 1 on which cylindrical electrodes 3 and wires 9 are formed is set in upper metal mold 22 for sealing with resin. Moreover, a lower metal mold 23 is prepared which faces an upper metal mold 22 to form a pair. Lower metal mold 23 has a container-like shape capable of retaining resin material in a cavity inside. A film member 24 is attached to lower metal mold 23 so as to cover an inner wall surface of the cavity to which resin material is supplied. Upper metal mold 22 and lower metal mold 23 are clamped by so-called mold clamping so as to face with each other, so that substrate 1 set in upper metal mold 22 is placed in the cavity formed by upper metal mold 22 and an internal region of lower metal mold 23. At this time, since substrate 1 set in upper metal mold 22 is flipped vertically, it is preferable that upper metal mold 22 has a retaining force to an extent that substrate 1 does not drop from upper metal mold 22.

Upper metal mold 22 and lower metal mold 23 preferably has a flat plane shape, for example, a rectangular flat plane shape so that the region accommodating substrate 1 can fit to substrate 1. Film member 24 has, for example, a thickness of greater than or equal to 50 μm and less than or equal to 150 μm and is formed of at least one kind selected from the group consisting of, for example, a PET film, a Teflon (registered trademark) film, and a fluorine film.

Figure 11:
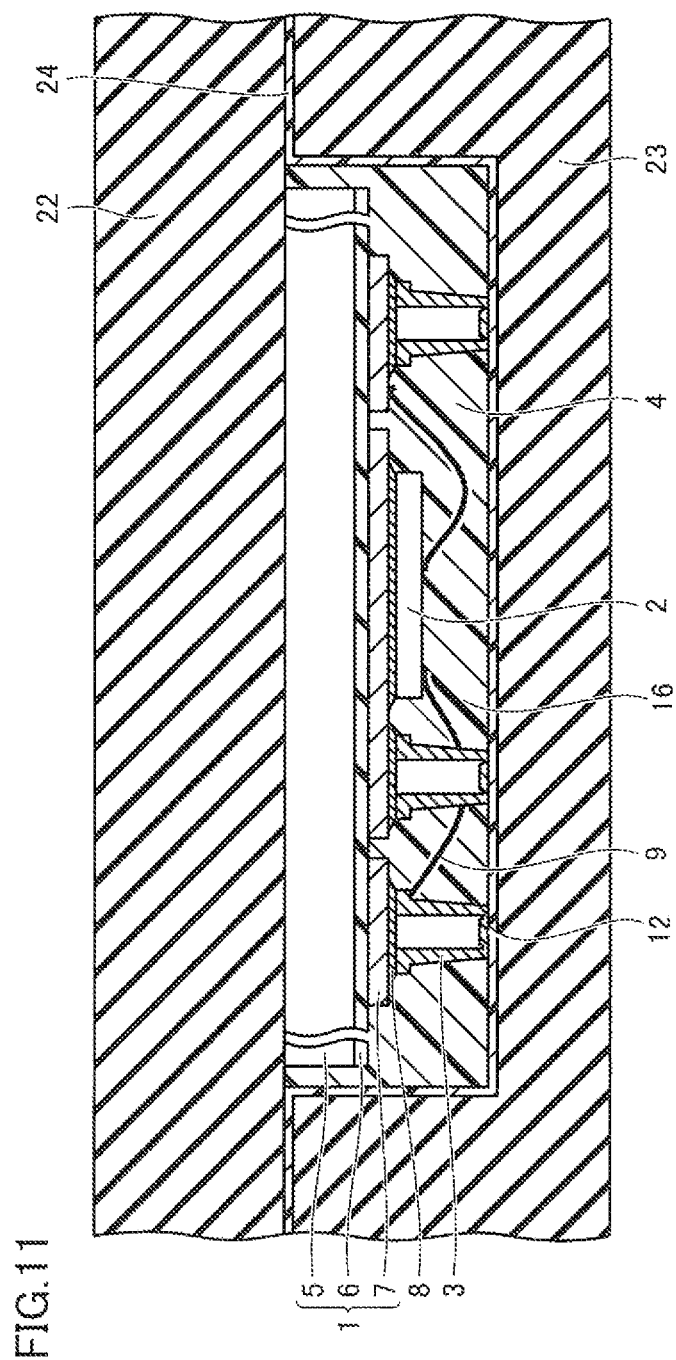
FIG. 11 is a schematic cross-sectional view corresponding to the region surrounded by the dotted lines in FIG. 4 and representing a seventh step of the method for manufacturing a power module according to the present embodiment.

Referring to FIG. 11, upper metal mold 22 and lower metal mold 23 of FIG. 10 are clamped by mold clamping so as to come into contact with each other particularly in the region outside of the region accommodating substrate 1. Accordingly, upper ends 12 of cylindrical electrodes 3 most apart from substrate 1 (in FIG. 11, the lowermost portions of cylindrical electrodes 3) come into contact with film member 24 so as to press film member 24. Since film member 24 has a high flexibility, when heights in the vertical direction of the plurality of cylindrical electrodes 3 aligned in FIG. 11 have unevenness, film member 24 can come into contact with all of upper ends 12 of cylindrical electrodes 3 to absorb the unevenness. Therefore, even when there is unevenness in the heights in the vertical direction of the plurality of cylindrical electrodes 3 aligned in FIG. 11, the presence of film member 24 allows a supply of resin material such that sneaking of resin material onto all of upper ends 12 of cylindrical electrode 3 is prevented.

Moreover, since the main surface of metal substrate 5 on a side opposite to the side adjacent to insulating layer 6 (the main surface on an upper side in FIG. 11) also typically comes into contact with the inner wall surface of upper metal mold 22 in cavity 16, resin material is basically not supplied onto the main surface.

In the state where upper metal mold 22 and lower metal mold 23 are clamped by mold clamping, cavity 16 between both molds is filled with mold resin 4 through a generally known transfer molding method. Specifically, resin material such as epoxy resin used in the transfer molding method is firstly heated and melted, and injected into cavity 16 as mold resin 4 in a low-viscosity state. Then, the resin material is subjected to a hardening reaction while retaining a pressure after filling of cavity 16 with the resin material is completed, so that solid mold resin 4 is formed. In such a manner, substrate 1, semiconductor chip 2, cylindrical electrode 3 are sealed with mold resin 4.

In the step of sealing, a generally known compression molding method or injection molding method may be used instead of the transfer molding method described above.

Figure 12:
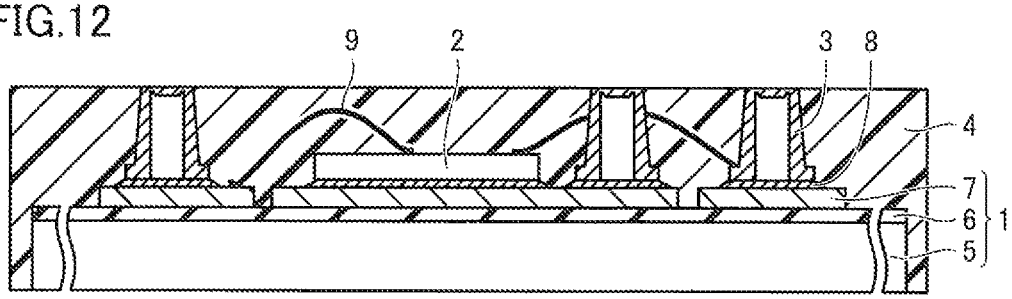
FIG. 12 is a schematic cross-sectional view corresponding to the region surrounded by the dotted lines in FIG. 4 and representing a eighth step of the method for manufacturing a power module according to the present embodiment.

Referring to FIG. 12, upper metal mold 22 and lower metal mold 23 are detached from substrate 1 sealed with mold resin 4. As described above, since the uppermost surface of upper end 12 of cylindrical electrode 3 is covered with film member 24, mold resin 4 is not supplied onto the uppermost surface. Therefore, upper end 12 is exposed from mold resin 4. Moreover, the main surface of metal substrate 5 on a side opposite to the side adjacent to insulating layer 6 is also exposed from mold resin 4.

Figure 13:
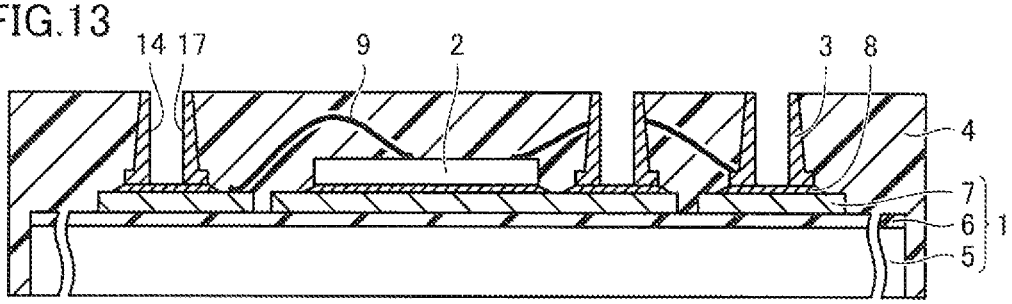
FIG. 13 is a schematic cross-sectional view corresponding to the region surrounded by the dotted lines in FIG. 4 and representing a ninth step of the method for manufacturing a power module according to the present embodiment.

Referring to FIG. 13, after substrate 1 and the like are sealed with mold resin 4, an opening 17 having a slit shape is formed which extends from upper end 12 of cylindrical electrode 3 to cavity 14 in cylindrical electrode 3. This opening 17 is formed by working with a generally known machining or a working with use of a punch press (press working). Preferably, opening 17 is formed to overlap with cavity 14 (edge 14a of cavity 14) in a planar view. Formed opening 17 integrates with cavity 14 to be cavity 14 penetrating through cylindrical electrode 3 from upper end 12 to lower end 11.

Although machining exhibits a high working accuracy, it produces machining scrap and requires a long machining time, so that the efficiency of working may be lowered. Therefore, by using the press working which causes less working scrap, the machining time can be shortened.

As described above, after sealing with mold resin 4 is performed and until opening 17 is formed in the step of FIG. 13, upper end 12 is in the state of being covered entirely with the main body of cylindrical electrode without having an opening.

Referring back to FIG. 2, extraction electrode 10 is inserted by the generally known press-fit connection into cavity 14 formed so as to penetrate through cylindrical electrode 3 in the step of FIG. 13. Specifically, extraction electrode 10 as a terminal having a width slightly larger than cavity 14 is press-fitted into cavity 14 from the side of upper end 12. Accordingly, plating films formed on the surfaces of extraction electrode 10 and cavity 14 come in contact with each other, so that both of these are electrically connected.

Finally, referring to FIG. 4, substrate 1 is cut for each of the plurality of power modules 100 formed to align in power module 200. Specifically, at dicing line region 101 sandwiched between the plurality of individual power modules 100 in the direction along the main surface of power module 200, power module 200 is cut along dicing line region 101, and divided into individual power module 100.

Next, the effects of the present embodiment will be described.

In the present embodiment, the sealing with resin is conducted in the state where upper end 12 of cylindrical electrode 3 is closed. Therefore, entry of mold resin 4 from upper end 12 into cavity 14 of cylindrical electrode 3 is suppressed.

If mold resin 4 enters cavity 14, there is a possibility that an electrical connection between inside of power module 100 and outside of power module 100 cannot be obtained even when extraction electrode 10 is inserted into cavity 14. Moreover, there is a possibility that mold resin 4 in cavity 14 disturbs insertion of extraction electrode 10. With the present embodiment, the entry of mold resin 4 into cavity 14 is suppressed, so that occurrence of the defect described above can be eliminated.

In the present embodiment, mold resin 4 is supplied in the state where upper end 12 is closed. Therefore, it would not be necessary to use a cap jig or sleeve for closing upper end 12 when mold resin 4 is supplied. Thus, since it would not be necessary to use a part not required for a supply of mold resin 4, the cost for manufacturing power module 100 can be reduced.

In the present embodiment, since mold resin 4 is supplied in the state where upper end 12 is closed, it would not be especially required to form cylindrical electrode 3 into a shape having a spring characteristic and press it strongly with use of metal molds 22 and 23 to close an opening of upper end 12 of cylindrical electrode 3 when mold resin 4 is supplied. Therefore, occurrence of defects such as a damage on solder 8 connecting cylindrical electrode 3 and circuit pattern 7 due to a strong stress can be suppressed.

Cylindrical electrode 3 of the present embodiment is formed so as to include flange 13 on a side of lower end 11, and flange 13 is mounted to circuit pattern 7 of substrate 1. Since flange 13 is mounted to substrate 1, a junction area between cylindrical electrode 3 and substrate 1 becomes large, so that a strength of the joint part with solder 8 is improved, and the reliability of the joint part can be improved. In view of this, occurrence of defects such as a damage on solder 8 connecting cylindrical electrode 3 and circuit pattern 7 due to a strong stress can be suppressed.

Moreover, the improvement in the strength of the join part can reduce the possibility of damaging solder 8 and underlying substrate 1 due to the stress exerted to upper end 12 during the step of forming opening 17 in cylindrical electrode 3.

Moreover, since cylindrical electrode 3 is mounted to circuit pattern 7 by flange 13 having a large joint area at lower end 11, a space is formed between, for example, flange 13 and circuit pattern 7, so that the possibility of entry of mold resin 4 into cavity 14 of cylindrical electrode 3 through the space can be reduced.

The outer periphery of cylindrical electrode 3 is inclined (with respect to the direction perpendicular to the main surface of substrate 1) so as to be gradually reduced from lower end 11 toward upper end 12. Therefore, the outer shape of cylindrical electrode 3 can be readily molded with the metal mold. Moreover, cylindrical electrode 3 having the outer shape described above can be readily detached from the metal mold after the molding with the metal mold.

Further, cylindrical electrode 3 having the outer shape described above can facilitate detachment of alignment jig 21 from retainer 21a.

Wall thickness T of upper end 12 of cylindrical electrode 3 (refer to FIGS. 3A and 3B) has cavity cutout 15 which is thinner than other region at least directly above the region overlapping with cavity 14 in a planar view, so that cylindrical electrode 3 on a side of upper end 12 can be punched more readily by, for example, the press working during formation of opening 17. Particularly, formation of cavity cutout 15 directly above the outer periphery of cavity 14, in other words, along edge 14a further facilitates punching of cylindrical electrode 3 by the press working.

Moreover, since cavity cutout 15 is provided, the space between the jig for punching of upper end 12 during formation of opening 17 and the bottom surface (inner wall surface) of cylindrical electrode 3 on a side of upper end 12 can be reduced. Therefore, the space can reduce the possibility of occurrence of machining defects such as undercut and burr at the part of press working.

Further, in the present embodiment, a plurality of cylindrical electrodes 3 are set in alignment jig 21, so that the plurality of cylindrical electrode 3 can be collectively supplied and mounted onto the main surface of substrate 1. Accordingly, cylindrical electrodes 3 can be mounted at desired positions with high accuracy, and cylindrical electrodes 3 can be mounted in an easy and highly efficient manner.

Further, in the present embodiment, film member 24 is supplied so as to cover the inner wall surface of the region forming cavity 16 of lower metal mold 23, and this film member 24 covers the uppermost surface of upper end 12 during the sealing with resin. Since film member 24 can cover all of the uppermost surfaces of upper ends 12 to absorb unevenness in vertical heights between the plurality of cylindrical electrodes 3, the resin material is supplied on the upper surfaces of cylindrical electrodes 3, so that the possibility of formation of a resin burr and the like on the uppermost surface can be reduced. If such a resin burr is formed, the volume of the members which should be removed to form opening 17 becomes larger by the amount of the resin burr during the subsequent step of forming opening 17, so that there is a possibility of lowering in the efficiency of working for formation of opening 17. Therefore, according to the present embodiment, lowering of the efficiency of working caused by the burr can be suppressed.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a semiconductor device, comprising the steps of:
   mounting a semiconductor chip and a cylindrical electrode on one main surface of a substrate, said cylindrical electrode including a side wall portion, a lower end, and an upper end, said upper end including an annular portion axially corresponding to said side wall portion and a transverse portion extending radially across said annular portion above a cavity formed in said cylindrical electrode, said transverse portion having a first axial thickness in a cavity cutout region directly above said cavity and a second axial thickness in another region directly above said cavity, wherein said first axial thickness is thinner than said second axial thickness;

sealing said substrate, said semiconductor chip, and said cylindrical electrode with resin material such that said lower end of said cylindrical electrode is mounted to said substrate and said upper end of said cylindrical electrode is exposed; and forming an opening extending through said transverse portion of said upper end of said cylindrical electrode to said cavity in said cylindrical electrode after said step of sealing, before performing said step of forming an opening, said upper end of said cylindrical electrode is closed by said transverse portion of said upper end.

2. The method for manufacturing a semiconductor device according to claim 1, wherein said cylindrical electrode is formed so as to include a flange on a side of said lower end, and said cylindrical electrode is mounted to said substrate at said flange.

3. The method for manufacturing a semiconductor device according to claim 1, wherein an outer periphery of said cylindrical electrode is inclined so that a size of an outer periphery of said cylindrical electrode in a planar view is gradually reduced from a side of said lower end to a side of said upper end.

4. The method for manufacturing a semiconductor device according to claim 1, wherein before performing said step of forming an opening, said cavity cutout region is directly above an outer periphery of said cavity.

5. The method for manufacturing a semiconductor device according to claim 1, wherein said step of mounting a cylindrical electrode includes the steps of:

retaining a plurality of said cylindrical electrodes by means of a single jig; and supplying said plurality of cylindrical electrodes collectively onto one main surface of said substrate by means of said jig.

* * * * *